United States Patent [19]
Pelly et al.

[11] Patent Number: 4,965,710
[45] Date of Patent: Oct. 23, 1990

[54] INSULATED GATE BIPOLAR TRANSISTOR POWER MODULE

[75] Inventors: Brian R. Pelly, Palos Verdes Estates; Ajit Dubhashi, Torrance, both of Calif.; Peter R. Ewer, Oxted, England

[73] Assignee: International Rectifier Corporation, El Segundo, Calif.

[21] Appl. No.: 438,094

[22] Filed: Nov. 16, 1989

[51] Int. Cl.$^5$ .......................................... H02M 7/5387
[52] U.S. Cl. ........................................ 363/56; 357/81; 361/388; 363/132; 363/141
[58] Field of Search ................. 363/56, 132, 141, 144, 363/147; 361/386, 388; 357/81

[56] References Cited

U.S. PATENT DOCUMENTS

| | | | |
|---|---|---|---|
| 4,458,305 | 7/1984 | Buckle et al. | 363/144 |
| 4,556,899 | 12/1985 | Kurihara et al. | 357/81 |
| 4,777,578 | 10/1988 | Jahns | 363/98 |
| 4,796,145 | 1/1989 | Oshikiri | 363/56 |
| 4,816,984 | 3/1989 | Porst et al. | 363/132 |

FOREIGN PATENT DOCUMENTS

| | | | |
|---|---|---|---|
| 187023 | 11/1983 | Japan | 363/132 |
| 2074799 | 11/1981 | United Kingdom | 363/132 |

OTHER PUBLICATIONS

Sean Young, "High-Speed, High-Voltage IC Driver for HEXFET or IGBT Bridge Circuits", 1988, International Rectifier Power MOSFET Application Notes, AN-978, pp. 1-8.

Primary Examiner—William H. Beha, Jr.
Attorney, Agent, or Firm—Ostrolenk, Faber, Gerb & Soffen

[57] ABSTRACT

A power module contains IGBT die along with integrated circuit driver chips and opto isolators or isolation transformers within the same module housing. Output terminals are provided which can be interfaced directly to control logic or microprocessors for operating the module. The IGBTs may have current-sensing electrodes to simplify current measurement and control functions.

17 Claims, 4 Drawing Sheets

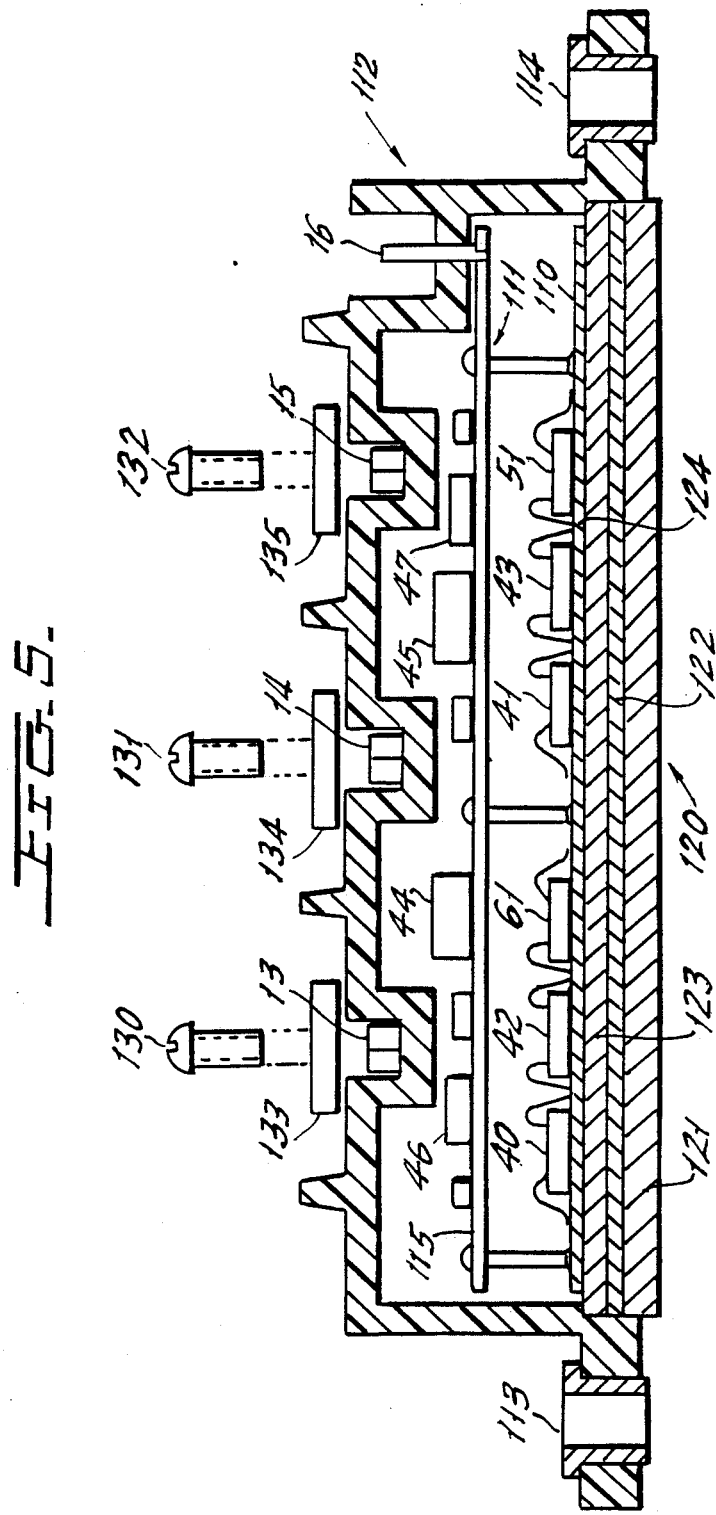

INSULATED GATE BIPOLAR TRANSISTOR POWER MODULE

BACKGROUND OF THE INVENTION

This invention relates to semiconductor device power modules, and more specifically relates to a novel power module employing insulated gate bipolar transistors ("IGBT") with self-contained driver and control circuits.

Power module semiconductor devices are well known and are generally multiple die packages for high power applications such as uninterruptible power supplies, motor drive controls, switching power supplies and high frequency welders. Such power modules will typically contain two or more semiconductor device die which may be diodes, thyristors, MOSFETs or Darlington-connected transistor die or combinations of such a die which are connected in predetermined circuit relationships such as half-wave bridges, full-wave bridges, parallel connections and the like. The die are usually thermally coupled to but are electrically isolated from a massive heat sink. The module then contains an insulation housing for enclosing the die and their connections. Terminal connections for a.c. or d.c. terminals and for control terminals are made available at the surface of the housing.

A typical power module is disclosed in International Rectifier Data Sheet No. PD-9.453B which illustrates a half-bridge configuration consisting of two power MOSFETs contained within a common housing and connected in good thermal relationship to a massive heat sink. This Data Sheet appears in the "HEXFET Power MOSFET Designer's Manual" published by International Rectifier Corporation, 4th Edition, dated 9/87, pages F-39 through F-44. The internal construction of such devices is illustrated typically in U.S. Pat. No. 4,047,197.

Power modules now require external driver circuits, external isolators to isolate control circuitry from the power devices within the housing and appropriate control circuits designed for the power modules such as current-limiting and current-tripping circuits which respond to a fault or other current condition sensed in the output current. Thus, considerable external circuitry has to be designed or provided by the user of the module.

It has also been desirable to use IGBT die in place of, for example, bipolar Darlington transistor die in power modules particularly for motor drive applications. However, standard IGBTs generally have only a few microseconds short-circuit capability whereas motor-drive applications require at least 10 to 20 microseconds short-circuit capability.

IGBT characteristics can be modified for higher short-circuit ability but only at the expense of other important device characteristics.

SUMMARY OF THE INVENTION

In accordance with a first aspect of the present invention, it has been recognized that an IGBT device can be driven by relatively simple, low power consumption drive circuits as compared, for example, to the more complex high power drive circuits needed by bipolar devices In accordance with the invention, individual small sized semiconductor chips containing integrated drive circuits including current-limiting and current-tripping features are contained within the housing of the power module. Electrical isolation of the externally applied drive signals is achieved via a small opto isolator or isolation transformer that can also be contained within the housing of the power module. Thus, the user of the power module is no longer concerned with the need for auxiliary isolation or drive circuit design and can use the module simply by connecting the module power terminals to his power circuit and by interfacing the isolated input terminals on the module directly to the user's control logic or microprocessors or the like. The resulting module will be extremely rugged and will be self-protected against overcurrent and will have an enhanced overall system reliability.

As a further feature of the invention, the IGBT chip which is employed is one containing current-sensing features. Thus, it is known that power MOSFETs which are multicellular devices can have a few of its cells isolated from the main body of cells. A separate source connection is made to the isolated cells, and the current through the isolated cells will be proportional to the total current through the chip.

Current-sensing power MOSFETs of this type are shown and described in International Rectifier Application Note 959 contained at pages I-151 through I-156 of the aforementioned "HEXFET Power MOSFET Designer's Manual" published by International Rectifier 9/87.

IGBTs have the same multicellular structure as a power MOSFET but will have a substrate which is of a conductivity type opposite to that of the epitaxially formed layer which contains the multicellular structure defining the device. Consequently, by simply isolating selected cells of an IGBT device in a manner identical to that employed in the manufacture of current-sensing MOSFETs, a sense terminal is made available which will carry a small current which is directly proportional to the total current flowing through the IGBT main terminals. A commercially available current-sensing IGBT device is the device type GSI525 of the General Electric Company The sense terminal can then be suitably coupled to the current-monitoring circuits in the driver chip which is contained in the same package with the main IGBT power die. By providing this current-measuring function, it becomes possible to employ an IGBT device with only a few microsecond short-circuit capability in power drive applications such as motor drives, and to be sure of protecting the IGBT device and load against damage in the event of a fault condition by immediately modulating the gate as soon as an excess current is sensed. By way of example, the IGBT can be internally current limited to about twice the normal peak working current so that IGBT power modules can be safely used in motor-drive applications without concern for the limited short-circuit capability of an IGBT.

Other features and advantages of the present invention will become apparent from the following description of the invention which refers to the accompanying drawings.

BRIEF DESCRIPTION OF THE DRAWINGS

FIG. 5 is a partial cross-sectional view of a further embodiment of a power module for the circuit of FIG. 4.

DETAILED DESCRIPTION OF THE DRAWINGS

Figure 1:
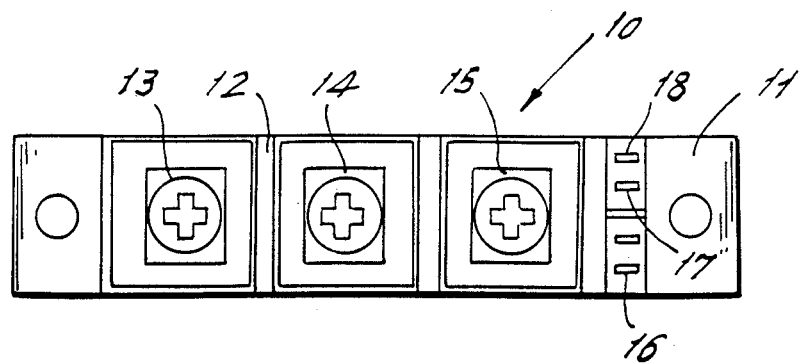
FIG. 1 shows a top view of the package outline of a typical power module which can house the IGBT and self-contained drivers and isolators of the invention.
Figure 2:
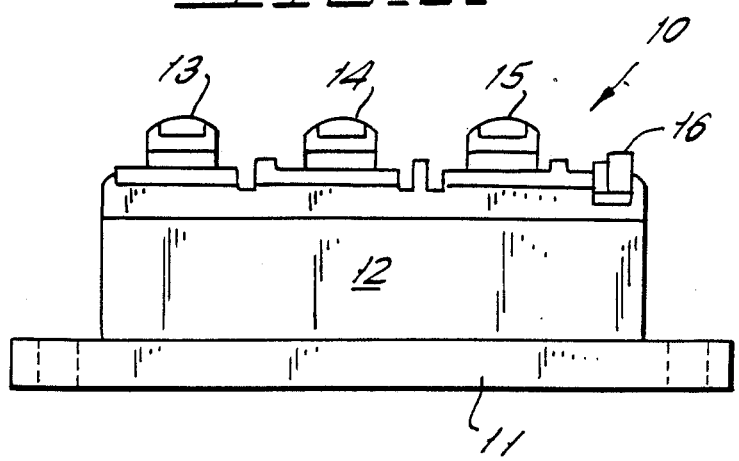
FIG. 2 is a plan view of the power module of FIG. 1.

Referring first to FIGS. 1 and 2, there is shown therein a typical power module 10 which consists of a heavy conductive base plate 11 which can be bolted to a heat sink. An insulation housing 12 houses bare semiconductor die or junctions which are thermally coupled to the base plate 11 and which are connected to one another in predetermined patterns, for example, as a half bridge, full-wave bridge or the like. For example, the housing of FIGS. 1 and 2 is adapted to define a half-bridge configuration and will contain two semiconductor chips in series with one another having the same junction polarity, with the outer ends of the series circuit defining positive and negative terminals, respectively, and the node between the two devices defining an a.c. output lead. Terminals on the exterior of the housing 12 are connected to the interior die and comprise screw terminals 13, 14 and 15 which define an a.c. terminal, a positive terminal and a negative terminal, respectively. In addition to the power module terminals 13 through 15, the housing surface also contains a plurality of control terminals 16, 17 and 18 which are electrically connected to the control electrodes of die which may be contained within the housing 12.

The housing package has an outline similar to JEDEC Outline TO-240AA. It has a total length of approximately 92 millimeters, a width of approximately 20 millimeters and a height of approximately 32 millimeters. Such devices will provide voltage outputs of about 500 volts with an on-resistance of about 200 milliohms and will have an output current of about 22 amperes. The current capability can be substantially increased by placing any desired number of power die in parallel with one another.

As will be hereinafter described, one aspect of the present invention lies in the recognition that a driver chip containing current-monitoring circuitry for an IGBT and an opto isolator chip or isolation pulse transformer are extremely small since IGBTs have relatively low drive power requirements and, therefore, can be contained within the housing 12 of FIGS. 1 and 2 along with the plural IGBT die.

Figure 3:
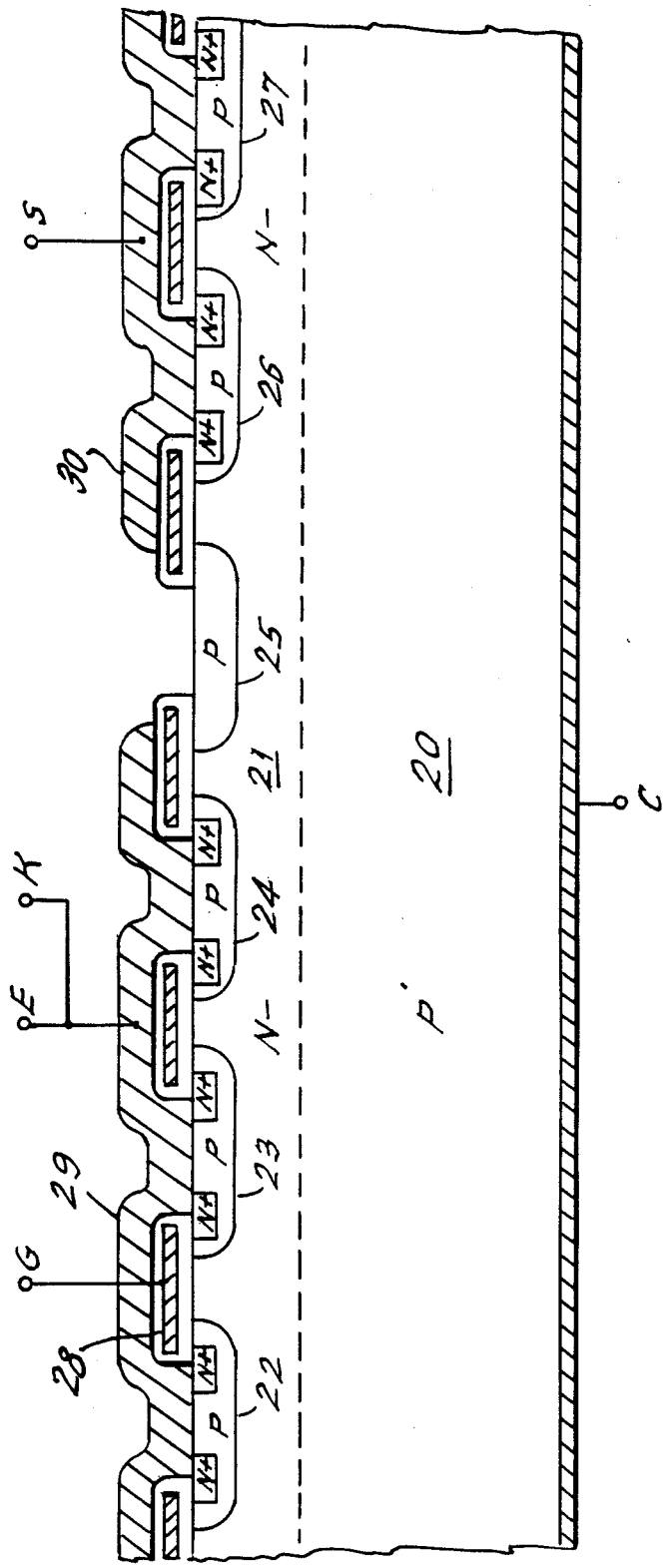
FIG. 3 is a schematic cross-sectional view of a few cells isolated from the body of cells of an IGBT device to produce current-sensing capability.

FIG. 3 illustrates a portion of an IGBT device to illustrate the manner in which a few cells of the device can be isolated to define a current-sensing output terminal Thus, in FIG. 3, the device is shown for an N channel IGBT which consists of a p type substrate 20 having an N(−) epitaxial layer 21 formed thereon. A large number of identical cells 22 through 27 is illustrated, each of which contains a respective source region. In actuality, a single die can contain several thousands of such cells on a chip which may be approximately ¼ inch by ¼ inch in area. An actual chip size which can be used is the HEX 5 size MOSFET die sold by the assignee of the present invention, but implemented as an IGBT instead of a MOSFET.

Polysilicon gate segments including gate segment 28 are then provided atop conventional gate oxide layers and provide the means for controlling the IGBT turn-on and turn-off. A common emitter (or source) electrode 29 covers the major upper surface of the die and is electrically connected to the various source regions of the device.

In accordance with well-known technology, it is possible to separate the sheet emitter electrode and to form a small isolated segment 30 of the electrode as shown in FIG. 3. Electrode segment 30 can be connected to a current-sensing terminal S in FIG. 3 while the main body of the emitter electrode 29 is connected to an emitter terminal and a terminal K, as shown.

In operation, when the device turns on, each cell carries its share of the total current of the device. Consequently, the current carried between the sensing electrode 30 and the collector electrode C fixed to the bottom of the p type region 20 will be a fixed proportion of the total main current between the emitter electrode 29 and the collector.

A current-sensing IGBT such as that of FIG. 3 is advantageously used as the IGBT device of the present invention.

Figure 4:
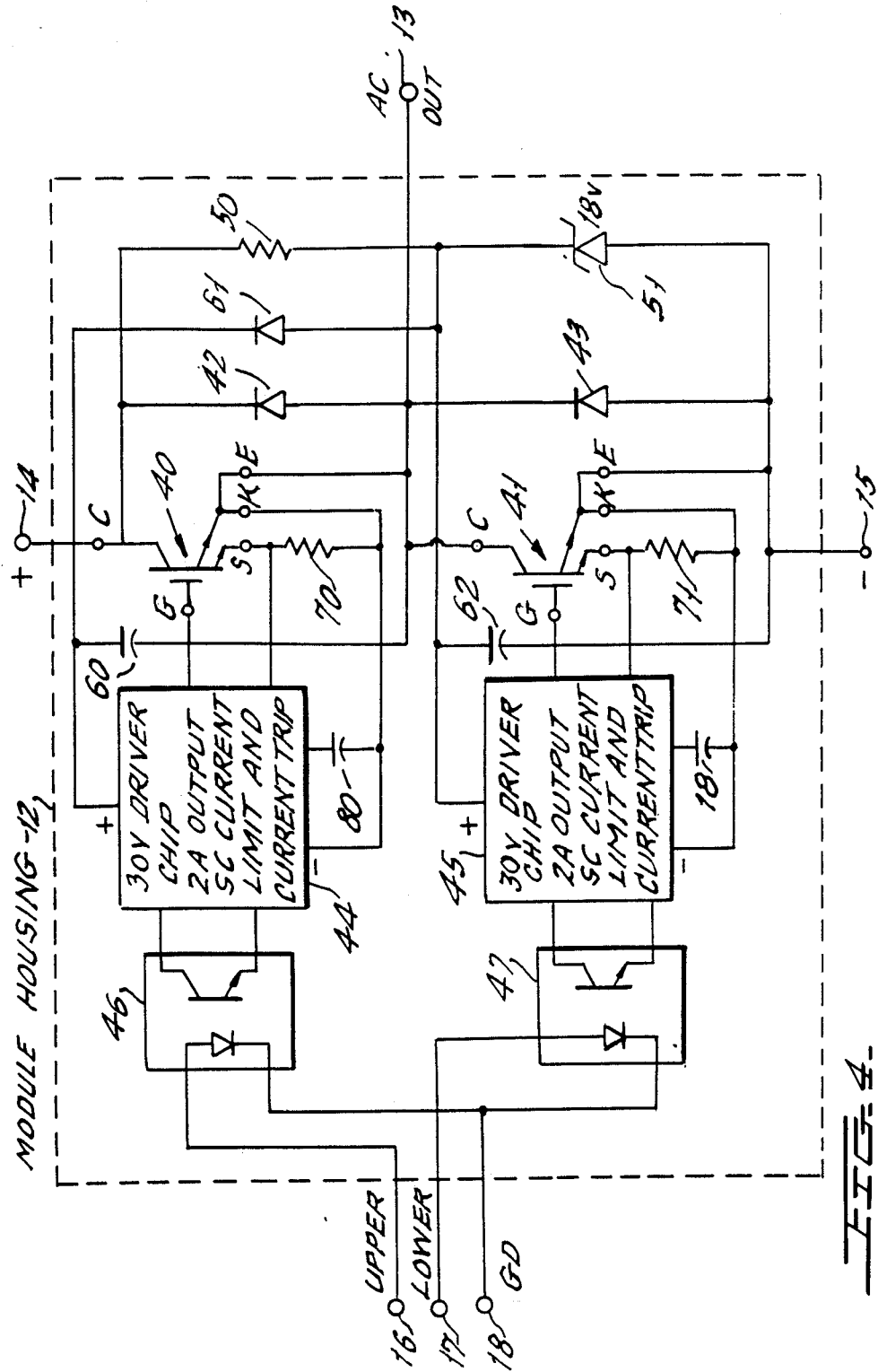
FIG. 4 is a schematic electrical diagram of the novel power module of the invention incorporating current-sensing devices.

FIG. 4 shows a circuit diagram of the present invention wherein all components of the device are contained within the module housing 12 schematically shown in dotted lines in FIG. 4

The novel half-bridge module circuit of FIG. 4 consists of two IGBT die 40 and 41, each of which contains terminals corresponding to those described in FIG. 3 Devices 40 and 41 are connected from the positive terminal 14 of housing 12 and negative terminal 15, respectively, and the node between the two is connected to the a.c. output terminal 13. If desired, any number of parallel-connected IGBT die can be used to increase the current rating of the device.

Freewheeling diodes 42 and 43 are connected in parallel with IGBTs 40 and 41, respectively, in a known manner, where these diodes are preferably fast-recovery diodes having the substantially same voltage and current rating as the IGBT. Diodes 42 and 43 are in die form and will be thermally coupled to and carried on the same heat sink 11 of FIGS. 1 and 2 with the power IGBTs 40 and 41.

Two integrated circuit chips 44 and 45 are provided to drive and control IGBTs 40 and 41, respectively, in response to certain output current conditions. Each of these chips can be implemented in very small integrated circuit form and the chip can be mounted with the IGBTs 40 and 41 or can be freely suspended within the housing, if desired. The driver circuits can have the structure set forth in Application Note AN-978 entitled "High-Speed, High-Voltage IC Driver for HEXFET or IGBT Bridge Circuits" by Sean Young, dated June 1988.

Two opto isolator circuits 46 and 47 of conventional form are also provided for the driver chips 44 and 45, respectively. The opto isolators, each in its own housing, are contained within the module housing 12. Alternatively, small pulse isolation transformers can be used in place of the optoisolators.

The external control terminals 16, 17 and 18 in FIG. 4 correspond to an upper device control terminal for IGBT 40, a lower device control terminal 17 for IGBT 41 and a ground terminal 18. The upper and lower terminals 16 and 17 are connected to the LEDs of opto isolators 46 and 47, respectively. Each of terminals 16, 17 and 18 can be connected to a user's control logic or microprocessor or the like.

As pointed out previously, a number of IGBTs can be connected in parallel to define a higher rating. By way of example, six die can be connected in parallel, each having an area of ¼ inch by ¼ inch and operated at 5 kilohertz to define a 600 volt, 150 to 200 ampere power supply.

Control power for the driver chips 44 and 45 is derived from the circuit including the dropping resistor 50 and Zener diode 51. The dropping resistor 50 may have a rating of approximately 1 watt for each parallel-connected IGBT device. Zener diode 51 may be an 18 volt Zener rated at about 0.30 watt actual dissipation when using six parallel-connected IGBT devices in place of the single devices 40 and 41. Alternatively, control power can be derived from a power supply such as the one disclosed in copending application Ser. No. 07/366,689, filed June 15, 1989, entitled "CASCADED BUCK CONVERTER CIRCUIT WITH REDUCED POWER LOSS" (IR-955) suitably modified with suitable current control functions.

There is next provided a boot strap capacitor 60 and diode 61 where capacitor 60 may have a capacitance of 1-10 microfarads at 30 volts. The lower IGBT 41 is provided also with a capacitor 62 which may also have a capacitance of 1-10 microfarads at 30 volts.

The operation of the boot strap circuit is as follows:

While device 41 is on, boot strap capacitor 60 is charged from the bias voltage produced by zener diode 51 and through boot strap diode 61. As IGBT 41 turns off and IGBT 40 starts to turn on, the source voltage of IGBT 40 rises, the voltage on capacitor 60 rises accordingly, reverse biasing boot strap diode 61, and providing a floating bias supply referenced to the source of IGBT 40. A low voltage buffer within driver 44 (not shown) is used to drive IGBT 40. Capacitor 60 is regularly recharged by turning on IGBT 41.

The sense contact of each of IGBTs 40 and 41 is connected in series with sensing resistors 70 and 71, respectively, which, in the case of six parallel-connected IGBTs at each of IGBT positions 40 and 41, would have a rating of about 0.2 watt.

The voltage developed across the sensing resistor is functionally related to the total power current through respective IGBTs 40 and 41 and a signal proportional to that current is fed back to the control circuits of the driver chips 44 and 45. Typically the chips 44 and 45 will be 30 volt driver chips with a 2 ampere output. Each of the driver chips is also provided with timing capacitors 80 and 81, respectively, each of which can be 0.001 microfarad devices at 30 volts. Each of the driver chips has an output electrode connected to the gates of IGBTs 40 and 41, respectively, to control turn-on and turn-off of its respective device. The driver chips 44 and 45 will also contain short circuit current-limiting circuits and current trip circuits which are responsive to the signal measured across the sensing resistors 70 and 71. These circuits can be arranged in a manner well known to any circuit designer to limit current to no greater than two times normal peak working current by regulating the gate signal when the sense current attempts to exceed that value. They would also have an internal current trip set to activate after about 10 to 15 microseconds (this time is set by the above timing capacitors 80 and 81) if the current exceeds a nominal current for that length of time.

FIG. 5 shows another embodiment for housing the circuit of FIG. 4 in a power module, and particularly shows the interior of the module. The power module components are located in two spaced planes, a power device plane 110 containing the high power parts, and a control circuit plane 111 containing the low power control components. A single piece hollow rectangular box 112, open at its bottom, defines the body of the housing. One or more mounting eyelets 113 and 114 are on opposite sides of the bottom of the housing.

A printed circuit board 115, carrying the various control components, is disposed in plane 111 and carries control components such as the gate drivers 44 and 45 and optocouplers 46 and 47 (FIG. 4) and discrete parts associated with the low power control circuit. The terminals 16, 17 and 18 of FIG. 4 extend from the components on printed circuit board 115 and are accessible at terminals which extend through housing 112, as shown for terminal 16 in FIG. 5 which defines a plug-in type terminal The open bottom of housing 112 has a copper heat sink 120 fixed thereacross to complete the enclosure. Heat sink 120 can comprise two thin sheets of copper 121 and 122 with a layer 123 of insulation material that has copper 122 directly bonded thereto.

The direct bonded copper on layer 124 can be patterned as desired to receive and provide insulated electrode layers for various power devices. As an example, power devices 40, 41, 42, 43, 51 and 61, all in die form, have their back surfaces soldered to insulated conductive segments of layer 124. Their control terminals are interconnected as desired. Plural devices, not shown, can be used in parallel for each of the single devices shown.

Conductors within the housing 112, not shown, make connection, through housing 112, to the external terminal nuts 13, 14 and 15. Power conductors can be connected to terminals 130, 131 and 132 and their respective pressure bars 133, 134 and 135.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device power module comprising, in combination a conductive heat sink, a plurality of power semiconductor die mounted in thermal conductive relation with said conductive heat sink; each of said power semiconductor die having a pair of main power terminals and a control terminal operable to turn its respective die on and off; a control circuit semiconductor device for each of said power die; said control circuit semiconductor devices having input terminals and output terminals; said output terminals of said control circuit semiconductor devices being connected between at least one of said main power terminals and said control terminal of their respective power die; an isolation coupler device for each of said control circuit semiconductor devices having isolated input and output terminals; said isolation coupler device output terminals connected to said input terminals of their respective control circuit semiconductor device; a local power supply for each of said control circuit semiconductor devices which is coupled between and energized by selected power terminals of said power semiconductor die; an insulation housing connected to said conductive heat sink and enclosing each of said power semiconductor die, said control circuit semiconductor devices, said isolation coupler devices and said local power supplies and their interconnections; a plurality of external power connection terminals fixed to the exterior surface of said insulation housing and electrically connected to said main power terminals of said power semiconductor die; and a plurality of external control terminals fixed to the exterior surface of said insulation housing and electrically connected to said input terminals of said isolation coupler devices.

2. The power module of claim 1 wherein each of said power semiconductor die have a further current-sensing terminal which has an output current generally proportional to the current between its pair of main power terminals; each of said control circuit semiconductor devices including current-responsive control circuits and terminals therefor; said current-sensing terminal of said power semiconductor die being coupled to said current-responsive control circuit of its respective control circuit semiconductor device.

3. The module of claim 2 wherein each of said power semiconductor die are IGBTs.

4. The module of claim 3 which further includes a plurality of power diodes in die form; each of said power diodes thermally coupled to said heat sink and respectively connected in parallel with respective ones of said power semiconductor die and acting as respective freewheeling diodes.

5. The module of claim 1 wherein said local power supply comprises a Zener diode.

6. The module of claim 2 wherein said local power supply comprises a Zener diode.

7. The module of claim 3 wherein said local power supply comprises a Zener diode.

8. The module of claim 4 wherein said local power supply comprises a Zener diode.

9. The module of claim 1 wherein said external power connection terminals include at least first and second d.c. terminals coupled to first and second power semiconductor die and an a.c. terminal connected to each of said first and second power semiconductor die, whereby said module defines at least a half bridge structure.

10. The module of claim 2 wherein said external power connection terminals include at least first and second d.c. terminals coupled to first and second power semiconductor die and an a.c. terminal connected to each of said first and second power semiconductor die, whereby said module defines at least a half bridge structure.

11. The module of claim 3 wherein said external power connection terminals include at least first and second d.c. terminals coupled to first and second power semiconductor die and an a.c. terminal connected to each of said first and second power semiconductor die, whereby said module defines at least a half bridge structure.

12. The module of claim 4 wherein said external power connection terminals include at least first and second d.c. terminals coupled to first and second power semiconductor die and an a.c. terminal connected to each of said first and second power semiconductor die, whereby said module defines at least a half bridge structure.

13. The module of claim 6 wherein said external power connection terminals include at least first and second d.c. terminals coupled to first and second power semiconductor die and an a.c. terminal connected to each of said first and second power semiconductor die, whereby said module defines at least a half bridge structure.

14. The module of claim 8 wherein said external power connection terminals include at least first and second d.c. terminals coupled to first and second power semiconductor die and an a.c. terminal connected to each of said first and second power semiconductor die, whereby said module defines at least a half bridge structure.

15. The module of claim 1 wherein said power semiconductor die are selected from the group consisting of MOSFETs, IGBTs, thyristors, Darlington-connected transistors and power transistors.

16. The module of claim 5 wherein said power semiconductor die are selected from the group consisting of MOSFETs, IGBTs, thyristors, Darlington-connected transistors and power transistors.

17. The module of claim 9 wherein said power semiconductor die are selected from the group consisting of MOSFETs, IGBTs, thyristors, Darlington-connected transistors and power transistors.

* * * * *